(12) United States Patent
Garani et al.

(10) Patent No.: US 10,439,643 B2
(45) Date of Patent: Oct. 8, 2019

(54) REED-SOLOMON DECODERS AND DECODING METHODS

(71) Applicant: Indian Institute of Science, Bangalore (IN)

(72) Inventors: Shayan Srinivasa Garani, Karnataka (IN); Thatimattala S V Satyannarayana, Karnataka (IN); Yalamaddi Vamshi Krishna, Karnataka (IN)

(73) Assignee: Indian Institute of Science (IN)

( * ) Notice: Subject to any disclaimer, the term of this patent is extended or adjusted under 35 U.S.C. 154(b) by 0 days.

(21) Appl. No.: 15/660,940

(22) Filed: Jul. 26, 2017

(65) Prior Publication Data

US 2018/0034481 A1 Feb. 1, 2018

(51) Int. Cl.
| | |
|---|---|
| H03M 13/15 | (2006.01) |
| H03M 13/11 | (2006.01) |
| H03M 13/00 | (2006.01) |
| H03M 13/35 | (2006.01) |
| H03M 13/37 | (2006.01) |
| H03M 13/45 | (2006.01) |

(52) U.S. Cl.
CPC .... *H03M 13/1515* (2013.01); *H03M 13/1111* (2013.01); *H03M 13/1525* (2013.01); *H03M 13/1545* (2013.01); *H03M 13/1565* (2013.01); *H03M 13/353* (2013.01); *H03M 13/3707* (2013.01); *H03M 13/45* (2013.01); *H03M 13/453* (2013.01); *H03M 13/617* (2013.01); *H03M 13/6561* (2013.01)

(58) Field of Classification Search
CPC .................................................. H03M 13/151
USPC ........................................ 714/784, 786, 787
See application file for complete search history.

(56) References Cited

U.S. PATENT DOCUMENTS

| | | | | |
|---|---|---|---|---|
| 5,644,695 A | * | 7/1997 | Blaum | G06F 11/1076 714/6.12 |
| 7,793,195 B1 | * | 9/2010 | Wu | H03M 13/1515 714/781 |
| 2003/0106014 A1 | * | 6/2003 | Dohmen | H03M 13/1535 714/785 |

* cited by examiner

*Primary Examiner* — Fritz Alphonse
(74) *Attorney, Agent, or Firm* — Dana Legal Services; Jubin Dana

(57) ABSTRACT

Embodiments of the present disclosure provide a high speed low latency rate configurable soft decision and hard decision based pipelined Reed-Solomon (RS) decoder architecture suitable for optical communication and storage. The proposed RS decoder is a configurable RS decoder that is configured to monitor the channel and adjust code parameters based on channel capacity. The proposed RS decoder includes interpolation and factorization free Low-Complexity-Chase (LCC) decoding to implement soft-decision decoder (SDD). The proposed RS decoder generates test vectors and feeds these to a pipelined 2-stage hard decision decoder (HDD). The proposed RS decoder architecture computes error locator polynomial in exactly 2t clock cycles without parallelism and supports high throughput, and further computes error evaluator polynomial in exactly t cycles. The present disclosure provides a 2-stage pipelined decoder to operate at least latency possible and reduced size of delay buffer.

14 Claims, 7 Drawing Sheets

REED-SOLOMON DECODERS AND DECODING METHODS

TECHNICAL FIELD

The present disclosure relates to the field of error correcting codes. In particular, the present disclosure relates to decoders and decoding methods for high speed storage and communication systems.

BACKGROUND

Background description includes information that may be useful in understanding the present invention. It is not an admission that any of the information provided herein is prior art or relevant to the presently claimed invention, or that any publication specifically or implicitly referenced is prior art.

High speed data transmission, such as transmission obtained through fiber-optical networking systems, and high speed data processing required for high speed storage devices requires efficient error correcting codes that can support high throughput to meet continuing demands of higher data rates. Reed-Solomon (RS) codes are popularly used in various storage and communication applications because of their guaranteed burst error correction capability. However, implementing a high speed and area efficient RS decoder architecture has always been a key challenge. Developing a suitable RS decoder architecture always requires a trade-off between throughput, area, and latency.

State of the art hard decision (HD) RS decoders implemented on FGPA hardly reach a maximum throughput of 2 Gbps. A recently released Xilinx's RS decoder IP supports a maximum throughput of 3.2 Gbps for the RS (255,239) code. Altera RS IP core also supports a maximum throughput of 3 Gbps for the RS (204,188) code.

As one may be aware, there are mainly two categories of decoding: algebraic Soft-Decision Decoders (SDD) and Hard-Decision Decoders (HDD), where SDD provides better correction performance than HDD with higher complexity. However, SDD requires large area for implementation. First and popular SDD based on Koetter-Vardy (KV) algorithm includes three main steps: multiplicity (m) assignment, interpolation, and factorization. One major problem of KV like architectures is that the SDD based on KV algorithm requires larger area due to complexity of interpolation and factorization steps.

Another issue with existing RS decoders is that it does not provide flexibility in terms of error correcting capabilities. Most of the existing RS decoders are configured with fixed error correction capability and perform decoding irrespective of channel characteristics and performance.

There is therefore a need in the art for a configurable RS decoder and a method thereof that can choose error correcting capability depending on channel characteristics and performance A RS decoder and a method of implementation/working thereof is also required to achieve high throughput and low latency for high speed storage and high speed transmission systems.

All publications herein are incorporated by reference to the same extent as if each individual publication or patent application were specifically and individually indicated to be incorporated by a reference. Where a definition or use of a term in an incorporated reference is inconsistent or contrary to the definition of that term provided herein, the definition of that term provided herein applies and the definition of that term in the reference does not apply.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS OF THE INVENTION

A general object of the present disclosure is to provide a RS decoder and decoding method for high-speed storage and high speed communication system.

An object of the present disclosure is to provide a configurable RS decoder and a decoding method thereof that can enable configurable error correcting capability depending upon channel characteristics and performance.

Another object of the present disclosure is to provide a RS decoder that requires less area than conventional RS decoders used in high speed storage and high speed communication systems for a specific throughput.

Yet another object of the present disclosure is to provide a RS decoder that can achieve high throughout and low latency for high speed storage and high speed communication applications.

SUMMARY

Aspects of the present disclosure relate to the field of error correcting codes. More particularly, the present disclosure relates to a decoder and decoding method for high speed storage and high speed communication systems.

Aspects of the present disclosure provide Reed-Solomon decoder architecture, and methods thereof. In an embodiment, a high-speed low latency rate configurable soft decision and hard decision based 2-stage pipelined Reed-Solomon (RS) decoder architecture is provided.

Embodiments of the present disclosure provide a Reed-Solomon (RS) decoder that includes a syndrome computation (SC) module configured to process test vectors and generate syndromes, wherein syndrome computation stage of the SC module takes 2t cycles to compute 2t syndromes, a key equation solver (KES) configured to compute error locator polynomials, and a Chien search and error magnitude computation (CSEMC) module configured to find error location and corresponding error magnitude, wherein the SC module, the KES and the CSEMC module are arranged in a 2-stage pipeline manner.

In an aspect, the RS decoder can be configured as a soft decision decoder (SDD), wherein the SDD is configured to use interpolation and factorization free Low-Complexity-Chase (LCC) decoding.

In another aspect, the RS decoder can be configured as a 2-stage hard decision decoder (HDD), wherein the HDD is a t-symbol correcting decoder based on Berlekamp-Massey (BM) algorithm that takes 2t iterations to obtain error locator polynomials.

In an aspect, the RS decoder is configured to monitor channel capacity, and adjust code parameters based on the monitored channel capacity.

In an aspect, the KES computes error locator polynomials using Berlekamp-Massey (BM) algorithm or Modified Euclidean (ME) algorithm.

In an aspect, a test vector generator module generates $2^\eta$ test vectors that are provided as input to the SC module. In an aspect, a delay buffer is configured to buffer the test vectors. In an aspect, the SC module is merged with the KES to achieve low latency and to reduce size of delay buffer.

In an aspect, the error locator polynomials are obtained in 2t clock cycles without any parallelism to achieve high throughput of the RS decoder.

In an aspect, the CSEMC module comprises J-Parallel Chien search architecture.

In an aspect, the present disclosure provides a decoding method for a Reed-Solomon (RS) decoder, the method including the steps of calculating, by a syndrome computation (SC) module, syndromes $S_j$ by processing test vectors; computing, by a key equation solver (KES), error locator polynomials $\sigma_i$ from the calculated syndromes $S_j$; and computing, by a Chien search and error magnitude computation (CSEMC) module, error location $X_i$ from the computed error location polynomial $\sigma_i$ and corresponding error magnitude $Y_i$.

In an aspect, the error locator polynomials $\sigma_i$ are calculated from the calculated syndromes $S_j$ using Berlekamp-Massey algorithm, and the error magnitude $Y_i$ is calculated using Forney's formula.

In an aspect, the method further includes the step of generating $2^\eta$ test vectors by a test vector generation module, wherein each test vectors of the $2^\eta$ test vectors is passed to the SC module.

In an exemplary implementation, HDD and SDD can be rate configurable and can be configured for use in various channel conditions. The RS decoder can be configured to monitor channel condition and configure the HDD and SDD accordingly.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION

Figure 1:
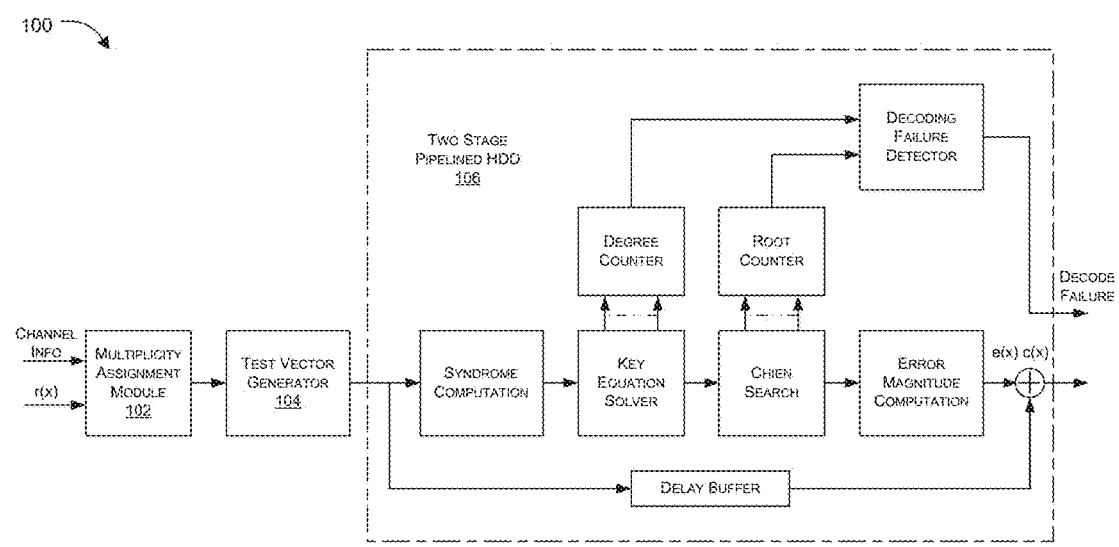
FIG. 1 illustrates an exemplary LCC soft decoder architecture that can be used for RS decoder in accordance with an embodiment of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

Aspects of the present disclosure relate to the field of error correcting codes. More particularly, the present disclosure relates to a decoder and decoding method for high speed storage and high speed communication systems.

Aspects of the present disclosure provide Reed-Solomon decoder architecture, and methods thereof. In an embodiment, a high-speed low latency rate configurable soft decision and hard decision based 2-stage pipelined Reed-Solomon (RS) decoder architecture is provided.

Embodiments of the present disclosure provide a Reed-Solomon (RS) decoder that includes a syndrome computation (SC) module configured to process test vectors and generate syndromes, wherein syndrome computation stage of the SC module takes 2t cycles to compute 2t syndromes, a key equation solver (KES) configured to compute error locator polynomials, and a Chien search and error magnitude computation (CSEMC) module configured to find error location and corresponding error magnitude, wherein the SC module, the KES and the CSEMC module are arranged in a 2-stage pipeline manner.

In an aspect, the RS decoder can be configured as a soft decision decoder (SDD), wherein the SDD is configured to use interpolation and factorization free Low-Complexity-Chase (LCC) decoding.

In an aspect, the RS decoder can be configured as a 2-stage hard decision decoder (HDD), wherein the HDD is a t-symbol correcting decoder based on Berlekamp-Massey (BM) algorithm that takes 2t iterations to obtain error locator polynomials.

In an aspect, the RS decoder is configured to monitor channel capacity, and adjust code parameters based on the monitored channel capacity.

In an aspect, the KES computes error locator polynomials using Berlekamp-Massey (BM) algorithm or Modified Euclidean (ME) algorithm.

In an aspect, a test vector generator module generates $2^\eta$ test vectors that are provided as input to the SC module. In an aspect, a delay buffer is configured to buffer the test vectors. In an aspect, the SC module is merged with the KES to achieve low latency and to reduce size of delay buffer.

In an aspect, the error locator polynomials are obtained in 2t clock cycles without any parallelism to achieve high throughput of the RS decoder.

In an aspect, the CSEMC module comprises J-Parallel Chien search architecture.

In an aspect, the present disclosure provides a decoding method for a Reed-Solomon (RS) decoder, the method including the steps of calculating, by a syndrome computation (SC) module, syndromes $S_j$ by processing test vectors; computing, by a key equation solver (KES), error locator polynomials $\sigma_i$ from the calculated syndromes $S_j$; and computing, by a Chien search and error magnitude computation (CSEMC) module, error location $X_i$ from the computed error location polynomial $\sigma_i$ and corresponding error magnitude $Y_i$.

In an aspect, the error locator polynomials $\sigma_i$ are calculated from the calculated syndromes $S_j$ using Berlekamp-Massey algorithm, and the error magnitude $Y_i$ is calculated using Forney's formula.

In an aspect, the method further includes the step of generating $2^\eta$ test vectors by a test vector generation module, wherein each test vectors of the $2^\eta$ test vectors is passed to the SC module.

In an exemplary implementation, HDD and SDD can be rate configurable and can be configured for use in various channel conditions. The RS decoder can be configured to monitor channel condition and configure the HDD and SDD accordingly.

Soft Decision Decoder (SDD)

In an exemplary implementation, chase decoding algorithm can be used for implementing the proposed SDD as the chase decoding algorithm provides low complexity when compared with other decoding techniques. As one may be aware, other decoding techniques such as algebraic soft decision decoding (ASD) of a RS decoder provides higher coding gain over conventional HDD but involves high computational complexity. ASD decoding facilitates correction of errors beyond bounded distance decoding by using channel reliability information, wherein among ASD methods, Guruswami-Sudan (GS) and KV algorithms give better performance at the expense of higher complexity. On the other hand, chase decoding offers a low complexity solution with comparable performance.

Low Complexity Chase Algorithm

SDD of the present disclosure can use a chase decoder that can be configured to be implemented with a HDD decoder in order to generate a set of test vectors, wherein the chase decoder is easy to implement without compromising on performance parameters. The proposed SDD can correct code words within a decoding radius $$t > \frac{dmin}{2},$$

where $d_{min}$ is the minimum distance of the code. Low complexity chase (LCC) decoder can be configured to generate $2^\eta$ test vectors based on symbol reliability information, where "$\eta$" symbols are selected as least reliable symbols out of n symbols, for which hard decision or second most reliable decision is employed. In order to create the test vectors, a ratio between probability of the hard-decision symbol and probability of the second-best decision can be established, wherein ratio can indicate how good the hard decision is. The desired probability ratio for the received message polynomial r(x) can be estimated using equation-1.

$$\prod_{1 \times n} = \frac{P(r_0 | r_{0\_HD})}{P(r_0 | r_{0\_2HD})} \cdots \frac{P(r_{(n-1)} | r_{(n-1)\_HD})}{P(r_{(n-1)} | r_{(n-1)\_2HD})} \qquad \text{Equation 1}$$

where $r_{i\_HD}$ is the hard decision of the symbols, and $r_{i\_2HD}$ is the second most reliable decision. Corresponding to $\eta$ points with the worst probability ratio (between the hard decision and second-best decision), a set of $2^\eta$ combinations called test vectors can be created by selecting the hard-decision symbol ($r_{i\_HD}$) or the second-best decision ($r_{i\_2HD}$) in η less reliable points. Second-best decision can be obtained based on information of message symbol probabilities.

For the sake of implementation, a reasonable and simple method of generating second-best decision and test vectors can be used. For example, BPSK modulation over AWGN channel can be used to generate symbol reliabilities and second most reliable decisions. Consider a codeword $c=[c_1 c_2 \ldots c_n]$ where $c_i=[c_{i1} c_{i2} \ldots c_{im}]$ is an m-bit vector. Co can be modulated to $x_{ij}$ and $x_{ij}=1-2c_{ij}$. Let $r_{ij}$ denote the real-valued channel observation corresponding to $c_{ij}$. $r_{ij}=c_{ij}+n_{ij}$, where $n_{ij}$ are Gaussian random noise samples.

In an aspect, at receiver, hard slicing is done and the received vector thus formed can be denoted as $y_i^{[HD]}$. In an aspect, a symbol decision $y_1^{[HD]}$ is made on each transmitted symbol $c_i$ (from observations $r_{i1}, \ldots r_{im}$). The channel provides reliability of each bit received. Among the m-bits in a symbol, the least reliable bit defines the worst case reliability of that symbol.

Symbol Reliability $\lambda_i$ of $i^{th}$ symbol can be calculated using $$\lambda_i = \min_{1 \leq j \leq m} |r_{ij}| \qquad \text{Equation-2}$$

The value $\lambda_i$ indicates confidence on the symbol decision $y_i^{[HD]}$, wherein higher the value of $\lambda_i$, greater is the reliability and vice-versa. Second most reliable decision $y_i^{[2HD]}$ is obtained from $y_i^{[HD]}$ by complementing or flipping the bit that achieves the minimum in above equation.

In an exemplary implementation, LCC algorithm can include steps of sorting n-symbol reliability $\lambda_1, \lambda_2, \ldots \lambda_n$ in increasing order, i.e. $\lambda_{i1} \leq \lambda_{i2} \leq \ldots \leq \lambda_{in}$, and forming an index $I=\{i_1, i_2, \ldots i_\eta\}$ denoting η-smallest reliability values. Further, set of $2^\eta$ test vectors are generated using the relations as below, $$y_i = \begin{cases} y_i^{[HD]}, & \text{for } i \notin I \\ \{y_i^{[HD]}, y_i^{[2HD]}\}, & \text{for } i \in I \end{cases} \qquad \text{Equation-3}$$

Further, each test vector is passed on to HDD stage serially and a vector for which the decoding failure does not result, that can be taken as estimated codeword at the receiver. In an exemplary implementation, HDD stage can be implemented based on Berlekamp-Massey algorithm.

Hard Decision Error Correction Procedure

In an exemplary implementation, RS decoder can perform error correction. Error correction procedure can be explained with help of example as below. For example, let a code $c(x)$ be corrupted by an additive error $e(x)$, resulting in $r(x)$. Suppose ν denotes the number of errors. Then, $e(x)$ has the following form $$e(x) = \sum_{i=1}^{v} y_i x^i, 0 \leq i \leq n-1 \qquad \text{Equation-4}$$

where $y_i$, is the error magnitude at error location i. The syndromes can be calculated as $$S_j = r(\alpha^j) = e(\alpha^j) = \sum_{i=1}^{v} Y_i X_i^j, 1 \leq j \leq 2t \qquad \text{Equation-5}$$

where $Y_i=y_i$ and $X_i=\alpha^i$. The aim is to solve the above 2t equations to get the pairs $(X_i, Y_i)$. In an exemplary implementation, a polynomial known as the error locator polynomial $\sigma(x)$ can be defined as $$\prod_{i=1}^{v}(1+X_i x) = \sigma_0 + \sigma_1 x + \cdots + \sigma_{v-1} x^{v-1} + \sigma_v x^v \qquad \text{Equation-6}$$

The $X_i$ values can be evaluated using inverse roots of the above equation. Given the values $X_i$, the equations-5 being linear in $Y_i$, can be solved.

In an embodiment, a method for decoding is provided. More particularly an error correction method for decoding is described, wherein the method includes the steps of calculating syndromes $S_j$, and calculating error location polynomial $\sigma_i$ from the $S_j$, error location $X_i$ from $\sigma_i$ and error magnitude $Y_i$. In an exemplary implementation, decoded codeword polynomial $c(x)$ can be obtained by adding $e(x)$ obtained from $X_i$ and $Y_i$. Detail of the each step is given as below.

Step 1: Calculation of syndromes $S_j$:

Syndromes can be evaluated using equation-5 from message polynomial $r(x)$.

Step 2: Calculation of error location polynomial $\sigma_i$ from $S_j$. In an exemplary implementation, error locator polynomial $\sigma_i$ can be calculated from $S_j$ using Berlekamp-Massey algorithm. In an exemplary implementation, $\sigma(x)$ can be calculated iteratively in 2t steps. Let $\sigma^\mu(x)$ denote the error locator polynomial at $\mu^{th}$ step of the iteration. To find $\sigma(x)$ iteratively, a logical table 1 can be filled. Let $l_\mu$, be the degree of $\sigma^{(\mu)}(x)$. When $\mu^{th}$ row of table-1 gets filled, the iterative steps can find $(\mu+1)^{th}$ row using procedure shown as below.

If $d_\mu = \sum_{i=0}^{l_\mu} S_{\mu+1} \sigma_i^\mu = 0$, then $\sigma^{(\mu+1)}(x) = \sigma^{(\mu)}(x)$ and $l_{\mu+1} = l_\mu$ If $d_\mu \neq 0$, another row ρ prior to $\mu^{th}$ row is searched, where $d_\rho \neq 0$ and number $\rho-l_\rho$ in last column of the table-1 has largest value. $\sigma^{(\mu+1)}(x)$, and $l_{\mu+1}$ is calculated repeatedly using equation-7 and equation-8 respectively.

$$\sigma^{(\mu+1)}(x) = \sigma^{(\mu)}(x) - d_\mu \sigma_\rho^{-1} x^{\mu-\rho} \sigma^\rho(x) \qquad \text{Equation-7}$$

$$l_{\mu+1} = \max[l_\mu, l_\mu + \mu - \rho] \qquad \text{Equation-8}$$

TABLE 1

| μ | $\sigma^{(\mu)}(x)$ | $d_\mu$ | $l_\mu$ | $\mu - l_\mu$ |
|---|---|---|---|---|
| −1 | 1 | 1 | 0 | −1 |
| 0 | 1 | $S_1$ | 0 | 0 |
| 1 | $1 - S_1 x$ | | | |
| ... | | | | |
| 2t | | | | |

Step 3: Calculation of error location $X_i$ from error location polynomial $\sigma_i$. In an exemplary implementation, error location $X_i$ can be calculated from error location polynomial $\sigma_i$ using Chien's search. In an exemplary implementation, if $\alpha^{-i}$ is a root of error locator polynomial $\sigma(x)$, it can be concluded that the error is present at location i.

Step 4: Calculation of error magnitude $Y_i$. In an exemplary implementation, error magnitude $Y_i$ can be calculated using Forney's formula given as Equation-9 below.

$$Y_i = -\frac{Z(X_i^{-1})}{\sigma'(X_i^{-1})}, \text{ where} \qquad \text{Equation-9}$$

$$Z(x) = S_1 + (S_2 + \sigma_1 S_1)x + (S_3 + \sigma_1 S_2 + \sigma_2 S_1)x^2 +$$
$$\ldots + (S_v + \sigma_1 S_{v-1} + \ldots + \sigma_{v-1} S_1)x^{v-1}$$

In an exemplary implementation, decoded codeword polynomial c(x) can be obtained by adding e(x) obtained from $X_i$ and $Y_i$.

FIG. 1 illustrates an exemplary LCC soft decoder architecture 100 that can be used for RS decoder in accordance with an embodiment of the present disclosure. As shown in FIG. 1, main steps for LCC decoding include (i) multiplicity assignments performed by multiplicity assignment module 102 (ii) creation of test vectors performed by test vector generator 104; and (iii) HDD of the test vectors performed by 2-stage pipelined HDD 106. In an aspect, LCC decoding process creates $2^\eta$ different test vectors using reliability information from received points, where $\eta<2t$. It has been proven that for $\eta>2t$ existing decoder's complexity is so high that its implementation is impractical. If one of $2^\eta$ test vectors has less than t+1 errors, the decoder will be able to correct them in all cases. The proposed architecture of RS decoder uses Berlekamp-Massey algorithm (BMA) based 2-stage pipelined HDD. For the BMA based RS decoder, a decoder failure happens if the received message generates an error locator polynomial $\sigma(x)$ of degree higher than number of roots obtained during Chien search procedure. In such a case, when the number of errors is more than t, the decoder cannot recover the message correctly. In an exemplary implementation, the LCC decoder can be designed with the following specifications.

RS (255,239) decoder over $GF(2^8)$ with $\eta=3$.

Number of bits for channel reliability information is 4-bits.

Inputs to decoder: $y^{[HD]}$, reliability information $\lambda_i$ of each symbol $y_i^{[HD]}$, information about the bit that needs to be flipped in a symbol.

BM algorithm based 2-stage pipelined HD decoder.

Multiplicity Assignment

In an exemplary implementation, multiplicity assignment module 102 can perform multiplicity assignment, wherein the module 102 can be configured to receive $\eta$ least symbol reliabilities. In the process of sorting the least symbol reliability values, the module 102 gets $\eta$ least symbol reliabilities in increasing order. In process of sorting these, $\eta$ least symbol reliabilities the module 102 gets the $\eta$ locations and the corresponding $r^{[2HD]}$ values. In an exemplary implementation, 'loc register' and '$r^{[2HD]}$ register' can be used to store the $\eta$ least symbol reliability locations and the corresponding secondary decision values respectively. 'Ch register' is useful to sort the symbol reliabilities.

Figure 2:
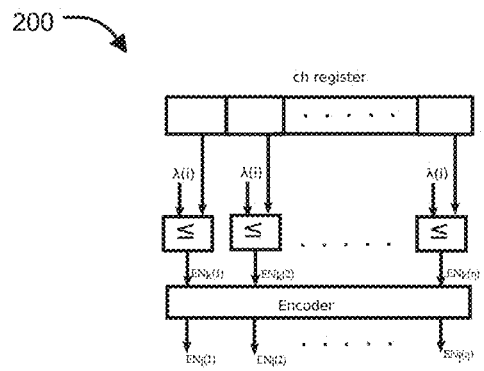
FIG. 2 illustrates sorting architecture that can be used for sorting least symbol reliability locations in accordance with an embodiment of the present disclosure.
Figure 3:
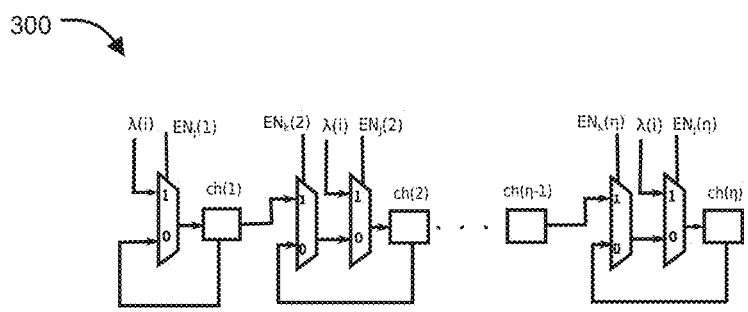
FIG. 3 illustrates sorting of least symbol reliability locations using "Ch register" in accordance with an embodiment of the present disclosure.
Figure 4:
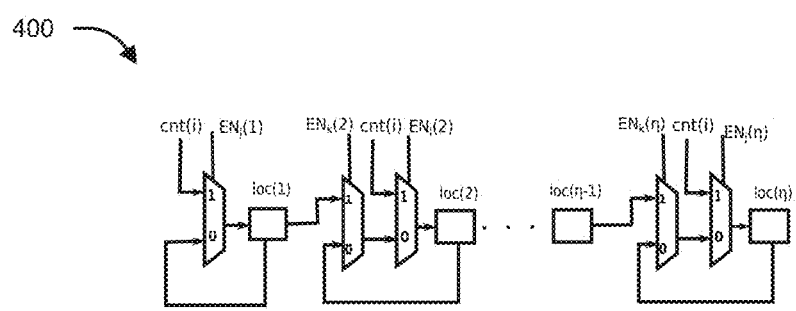
FIG. 4 illustrates loc register counting the least unreliable $\eta$ locations.
Figure 5:
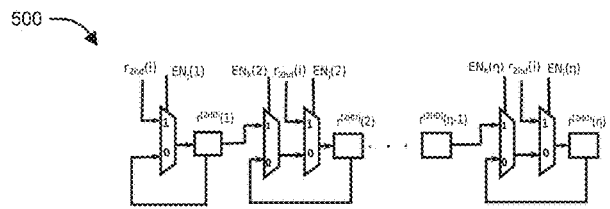
FIG. 5 illustrates an exemplary $r^{[2HD]}$ register containing second reliable symbols in $\eta$ locations.

FIG. 2 illustrates sorting architecture 200 that can be used for sorting least symbol reliability locations in accordance with an embodiment of the present disclosure. FIG. 3 illustrates sorting of least symbol reliability location using "Ch register" in accordance with an embodiment of the present disclosure. FIG. 2 and FIG. 3 show sorting of the symbol reliabilities. Each location in ch register is initialized with $2^q-1$, where q is the number bits used to represent each symbol reliability. Symbol reliabilities $\lambda(i)$ can be serially sent for i=0 to 255. In an exemplary implementation, $\eta$ comparators and an encoder logic shown in Table 2 can be used to generate $EN_k$ and $EN_j$ signals. These $EN_k$ and $EN_j$ signals can be used for loc register and $r^{[2HD]}$ register to get the least $\eta$ the symbol reliability locations and the corresponding secondary decision values respectively. In order to understand sorting, one can try an example with q=3 bits and input stream {5, 4, 6}. Each location in ch register can be initialized with 7. With the given architecture, one can get the required sorting order {4, 5, 6} in three clock cycles. Counter 'cnt(i)' running from 0 to n−1 is input for loc register as shown in FIG. 4. $r_i^{[2HD]}$ can be fed serially to $r^{[2HD]}$ register as shown in FIG. 5.

In an exemplary implementation, each symbol in "Ch register" can be initialized with all '1'. Symbol reliabilities $\lambda(i)$ are serially sent for i=0 to 255. In an exemplary implementation, $r_i$ comparators and encoder logic shown in Table 2 can be used to generate $EN_k$ and $EN_j$ signals. These $EN_k$ and $EN_j$ signals can be used for loc register and $r^{[2HD]}$ register to get the least $\eta$ symbol reliability locations and the corresponding secondary decision values respectively.

TABLE 2

| $EN_k$ (LSB to MSB) | $EN_j$ (LSB to MSB) |
|---|---|
| 1111 ... 1111 | 1000 ... 0000 |
| 0111 ... 1111 | 0100 ... 0000 |
| 0011 ... 1111 | 0010 ... 0000 |
| . | . |
| . | . |
| . | . |
| 0000 ... 0111 | 0000 ... 0100 |
| 0000 ... 0011 | 0000 ... 0010 |
| 0000 ... 0001 | 0000 ... 0001 |
| 0000 ... 0000 | 0000 ... 0000 |

FIG. 4 illustrates loc register counting the least unreliable $r_i$ locations. In an exemplary implementation, counter 'cnt (i)' running from 0 to 255 can be configured as input for loc register as shown in FIG. 4. FIG. 5 illustrates an exemplary $r^{[2HD]}$ register containing second reliable symbols in $\eta$ locations. In an exemplary implementation, $r_i^{[2HD]}$ can be fed serially to $r^{[2HD]}$ register as shown in FIG. 5.

Test Vector Generation

Figure 6:
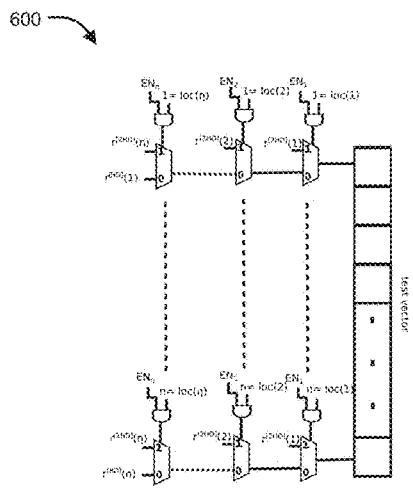
FIG. 6 illustrates an exemplary architecture that can be used for generating test vectors in accordance with an embodiment of the present disclosure.

FIG. 6 illustrates an exemplary architecture that can be used for generating test vectors in accordance with an embodiment of the present disclosure. As shown in FIG. 6, $2^\eta$ test vectors can be generated. In an exemplary implementation, a state machine can be used to control $EN_1$, $EN_2$, ... $EN_n$ and get $2^\eta$ test vectors. Each test vector of the $2^\eta$ test vectors can be passed to the 2-stage pipelined HDD 106.

Figure 7:
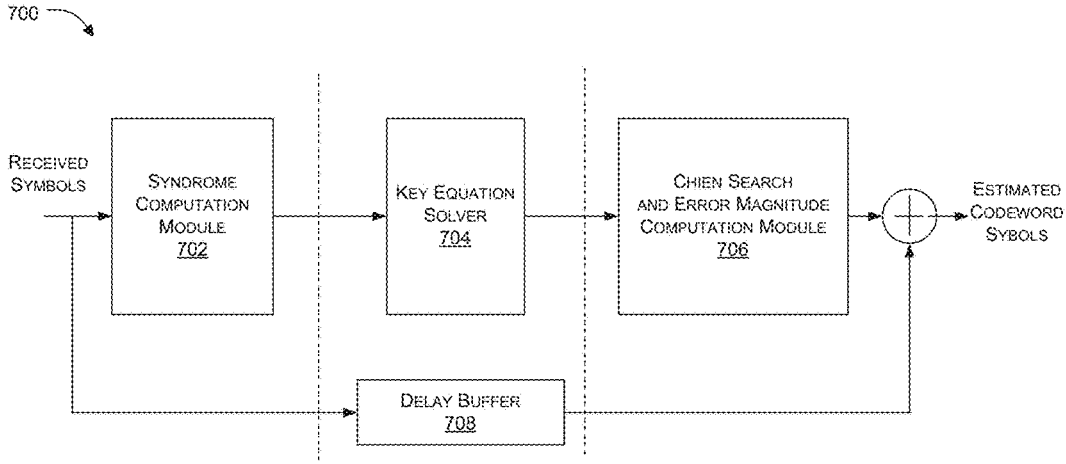
FIG. 7 illustrates an exemplary block diagram of a three stage pipe-lined RS decoder.

FIG. 7 illustrates an exemplary block diagram of a three stage pipe-lined RS decoder. As shown in FIG. 7, a RS decoder 700 includes a syndrome computation module 702 configured to compute syndromes, a key equation solver 704, and a Chien search & error magnitude computation module 706. The key equation solver 704 of the hard decision RS decoder can be implemented using Berlekamp-Massey (BM) algorithm or modified Euclidean (ME) algorithm in order to solve the key equation towards computing error locator polynomial. The ME algorithm is easier to understand and implement, whereas, the BM algorithm is efficient in terms of computational complexity and implementation. In a preferred implementation, BM algorithm can be used to implement a decoder circuit on FPGA. The error values can be computed using error evaluator polynomial. In an exemplary implementation, pipelining can be employed to RS decoder to achieve higher throughput. In a pipelined architecture, the overall throughput is decided by the slowest pipelined stage and its computation time. Therefore, in order to increase the throughput with efficient area utilization, each pipelined stage should complete its computations in about the same amount of time. The key equation solver (KES) 704 that computes error locator polynomial using BM algorithm requires 2t iterations. Given the syndromes and the error locator polynomial, Chien search and error magnitude computation 706 can be used for computing the error evaluator polynomial.

In an exemplary implementation, error locator and error evaluator polynomials can be used to find error locations and corresponding error magnitudes. Parallelism can be employed to adjust the number of clock cycles required for syndrome computation (SC) and Chien search and error magnitude computation stages. In an exemplary implementation, a delay buffer 708 can be used to buffer received symbols, wherein size of the delay buffer depends on latency of the decoder. Each functional block used for decoding using RS decoder of present disclosure is now described in more detail.

As one may appreciate, in most of the cases, KES 704 determines the throughput as other blocks can employ parallelism for evaluating polynomials at various field elements. This parallelism drives the trade-off between throughput and area. Size of the delay buffer 708 can be determined by the latency of the pipelined decoder, which is one of the reasons to decrease the latency.

Syndrome Computation (SC)

Figure 8:
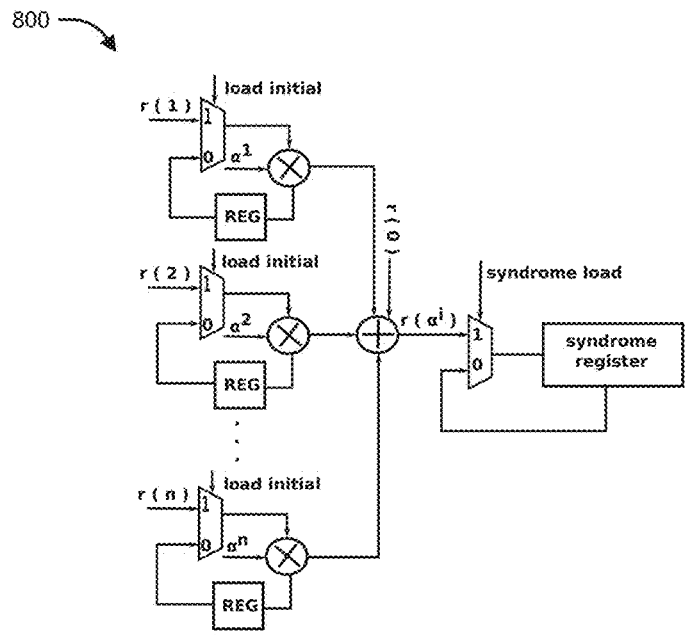
FIG. 8 illustrates an exemplary parallel architecture for syndrome computation that can compute 2t syndromes in accordance with an embodiment of the present disclosure.

In an exemplary implementation, syndrome computation (SC) can be performed by syndrome computation module 702. The syndromes are calculated as $S_j=r(\alpha^j)$, $1 \le j \le 2t$. FIG. 8 illustrates an exemplary parallel architecture for syndrome computation that can compute 2t syndromes in accordance with an embodiment of the present disclosure. Parallel architecture for syndrome computation 800 as shown in FIG. 8 can be used for determining the syndromes from message polynomial r(x). Initially, all registers 'REG' can be reset to zero. Once received vector is ready, 'load initial=1' can be marked for one clock cycle to load the valuer(i)$\alpha^i$ into the registers REG, which results in $S_1=r(\alpha)$ after the adder block is loaded into 'syndrome register'. Syndrome register works as a shift register with 'syndrome load' as an enable signal. For the next 2t−1 cycles, load initial=0 can be marked to get the remaining syndromes into syndrome register. In total, the SC stage takes 2t cycles to compute 2t syndromes.

Key Equation Solver (KES)

Figure 9:
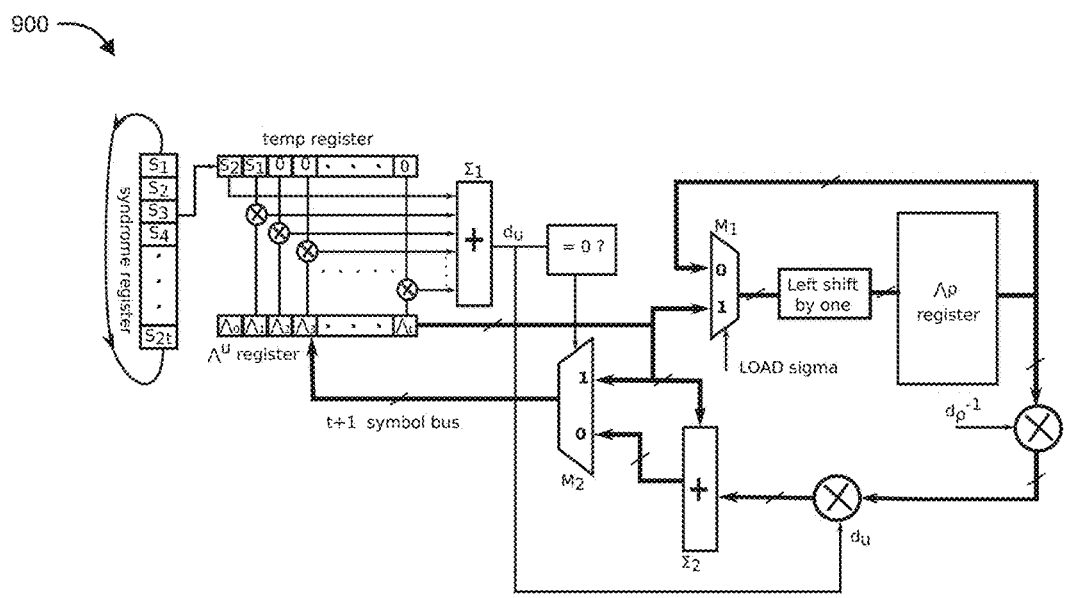
FIG. 9 illustrates an exemplary key equation solver architecture that is configured to compute error locator polynomial $\sigma(x)$ based on Berlekamp's iterative procedure in accordance with an exemplary of the present disclosure.

FIG. 9 illustrates an exemplary key equation solver architecture that is configured to compute error locator polynomial σ(x) based on Berlekamp's iterative procedure in accordance with an exemplary of the present disclosure. In an embodiment, low complexity key equation solver architecture 900 can be used to compute error locator polynomial σ(x) based on Berlekamp's iterative procedure in exactly 2t cycles. In an exemplary implementation, discrepancy factor $d_\mu$ can be calculated and correction factor $d_\mu d_\rho^{-1} x^{\mu-\rho} \sigma^\rho(x)$ can be calculated to update $\sigma^{(\mu+1)}(x)$ at $\mu^{th}$ iteration for $1 \le \mu \le 2t$. As one may appreciate, register and polynomial are used interchangeably throughout the specification to refer to the same entity. In an exemplary implementation, registers can store coefficients of the polynomial having the same name. In an exemplary implementation, registers $\sigma^\mu$ and $\sigma^\rho$ can be used to store coefficients of $\sigma^\mu(x)$ and $\sigma^\rho(x)$ respectively as shown in FIG. 9. Registers for $d_\rho$, $l_\rho$ and $l_\mu$ can also be used. Initially $\sigma^\mu$, $d_\rho$, $l_\rho$ can be loaded with values corresponding to $\rho=-1$. $\sigma^\mu$ and $l_\mu$, can be loaded with values corresponding to $\rho=0$ as per Table 1. When the decoding iterations proceed, $\sigma^\mu$ and $l_\mu$ gets updated when $d_\mu \ne 0$ with values as per equation 7 and equation 8 respectively. $\sigma^\mu$, $d_\rho$, $l_\rho$ get updated with $\sigma^\mu$, $d_\mu$, and $l_\mu$, correspondingly when $d_\mu \ne 0$ and $\mu-l_\rho \ge \rho-l_\rho$. In an exemplary implementation, discrepancy factor $d_\mu$ can be identified at every iteration using temp register of size t+1 initialized with $S_2$, $S_1$, 0, . . . 0 as shown in FIG. 9.

In exemplary implementation, temp register can act as a shift register yielding $d_\mu$ after the adder block Σ1. As one may observe, output of the adder block Σ2 can be $\sigma^\mu + d_\mu d_\rho^{-1} x^{\mu-\rho} \sigma^\rho$. The $\sigma^\mu$ register can be updated based on $d_\mu$ using multiplexer $M_2$. In Berlekamp iterative process, the syndrome register gets rotated 2t number of times to retain the initial syndrome values that can be used for the next pipeline stage. The idea of rotating the syndrome register 2t number of times saves significant number of registers as the key equation solver does not require another set of registers for storing the syndromes.

In an exemplary implementation, correction factor $d_\mu d_\rho^{-1} x^{\mu-\rho} \sigma^\rho$ can be computed to update $\sigma^\rho$ register. In an exemplary implementation, $d_\mu$ and $d_\rho$ can be evaluated, but $\mu-\rho$ may be any integer value. To compute $x^{\mu-\rho} \sigma^\rho$, a barrel shifter can be used to shift $\sigma^\rho$ by $\mu-\rho$. Barrel shifter is a complex combinational logic that takes huge area and affects maximum operating frequency, in turn affecting the throughput. If $x^{\mu-\rho} \sigma^\rho(x)$ can be stored in the $\sigma^\rho$ register instead of $\sigma^\rho(x)$, the barrel shifter can be avoided, which can be achieved by a simple 'left shift by one' or multiplying by x before loading into $\sigma^\rho$ register as shown in FIG. 9. With this approach, the initial value of $\sigma^\rho$ register should be x instead of '1' before starting the iterative decoding. When $d_\mu \ne 0$ and $\mu-l_\rho \ge \rho-l_\rho$, $\sigma^\rho$ register becomes $x\sigma^\mu$. In an exemplary implementation, 'LOAD sigma' shown in FIG. 9 can be used to update $\sigma^\rho$ register. After 2t number of iterations $\sigma^\rho$ register and $l_\mu$ contain the error locator polynomial σ(x) and v values respectively, that can be sent to next stage of the pipeline architecture.

Chien Search and Error Magnitude Computation

Figure 10:
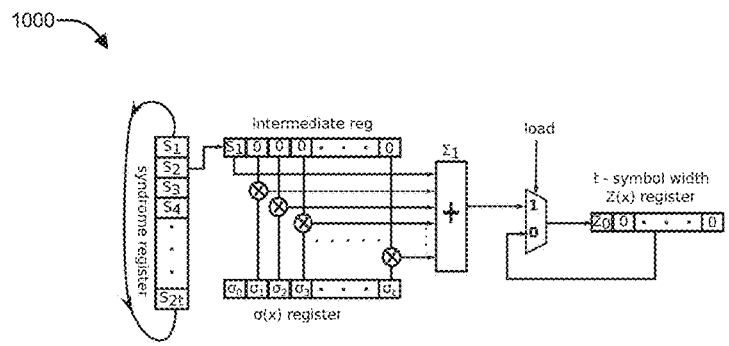
FIG. 10 illustrates an exemplary error evaluation architecture that can used to determine $Z(x)$ in accordance with an embodiment of the present disclosure.

Error evaluator Z(x) can be computed similar to the $d_\mu$ computation as shown in FIG. 9. FIG. 10 illustrates an exemplary error evaluation architecture that can used to determine Z(x) in accordance with an embodiment of the present disclosure. Architecture 1000 can be used to compute for error evaluation $Z(x)=S_1+(S_2+\sigma_1 S_1)x+(S_3+\sigma_1 S_2+\sigma_2 S_1)x^2 \ldots (S_v+\sigma_1 S_{v-1}+ \ldots +\sigma_{v-1} S_1)x^{v-1})$. As one can see, Z(x) contains $l_\mu$ coefficients and $Z_i$ is the coefficient of $x^i$. Each coefficient can be obtained one-by-one using the architecture 1000. In an exemplary implementation, a 'syndrome register' can be used to rotate left as shown in FIG. 10. A shift register 'intermediate reg' can be used that may be initialized with $S_1$, 0, 0, . . . 0. As the computations proceed, the intermediate register can be loaded from the second index of the syndrome register as shown in FIG. 10. The shift register can be multiplied index wise with 'σ(x) register' obtained from KES and summed to give each coefficient of Z(x). In an exemplary implementation, 'Z(x) register' of size t initialized with all zeros can be used to store the coefficients of Z(x). It is a shift register with an enable signal load that remains high for $l_\mu$ cycles to get all the coefficients into the Z(x) register. For $t-l_\mu$ cycles, Z(x)

register is rotated right to have $Z_0$ in the right most (least significant) position. It takes t number of cycles to compute all the coefficients of $Z(x)$.

In an exemplary implementation, J-parallel Chien search can be used to compute roots of a polynomial $f(x)=f_0+f_1x+f_2x^2+\ldots+f_nx^n$ over $GF(2^m)$. As one may appreciate, j field elements can be tested in one cycle. The RS decoder of present disclosure can use this architecture to evaluate $\sigma(\alpha^{-i})$ and $Z(\alpha^{-i})$ for $1\leq i\leq n$. In an exemplary implementation, each constant multiplicand of the architecture to its inverse can be changed.

In an exemplary implementation, $\sigma'(\alpha^{-i})$ can be used to compute error magnitude as per Forney's equation-9. To compute error magnitude, error locator and magnitude computation architecture can be used. The error locator and magnitude architecture can include $\sigma_{even}(x)$ and $\sigma_{odd}(x)$ constructed using even and odd coefficients of $\sigma(x)$ respectively. It turns out that $$\sigma'(\alpha^{-i}) = \frac{\sigma_{odd}(\alpha^{-1})}{\alpha^{-i}}$$

over a finite field of characteristic two.

In an exemplary implementation, J-parallel Chien search can be used for $\sigma_{even}(x)$ and $\sigma_{odd}(x)$ calculation separately to avoid evaluating $\sigma(\alpha^{-i})$ and $\sigma'(\alpha^{-i})$ separately. In an exemplary implementation, J-parallel Chien search architecture can also be used for $Z(x)$ to evaluate $Z(\alpha^{-i})$ to find the error magnitude at corresponding error location simultaneously. With J-Chien search architecture, j error magnitude generated in every clock cycle can be added to the corresponding received symbols to get the estimated codeword. To compute entire error vector, $$\frac{n}{j}$$

cycles may be required.

Table-3 below illustrates clock cycles required for each stage of the RS decoder.

TABLE-3

| Stage | Clock Cycles |
| --- | --- |
| Syndrome Computation | 2t |
| Key Equation Solver | 2t |
| Chien and Error Magnitude Computation | $t + \frac{n}{J}$ |

As one may appreciate, throughput of the decoder as a function of error correction capability can be calculated using equation-10 as below.

$$\text{Throughput}(t) = \frac{n \times m \times f_{max}}{\max\{2t, t+\frac{n}{J}\}} (Gbps) \qquad \text{Equation-10}$$

where n, m, t and $f_{max}$ denote code length, symbol width, error correcting capability and maximum operating frequency respectively. If J is chosen such that $$\frac{n}{j} = t,$$

the throughput is maximized. As one may appreciate, selection of J decides the trade-off between the throughput and hardware complexities. Similarly total latency of the designed Reed-Solomon decoder is given by sum of the cycles required for each stage as per Table 3.

$$\text{Latency} = 2t + 2t + t + \frac{n}{J} = 5t + \frac{n}{J} \text{(cycles)} \qquad \text{Equation-11}$$

As one may observe, when error evaluation computation and error magnitude computation are divided as independent pipeline stages, through put can be improved further.

2-Stage Pipelined Low Latency Decoder

Figure 11:
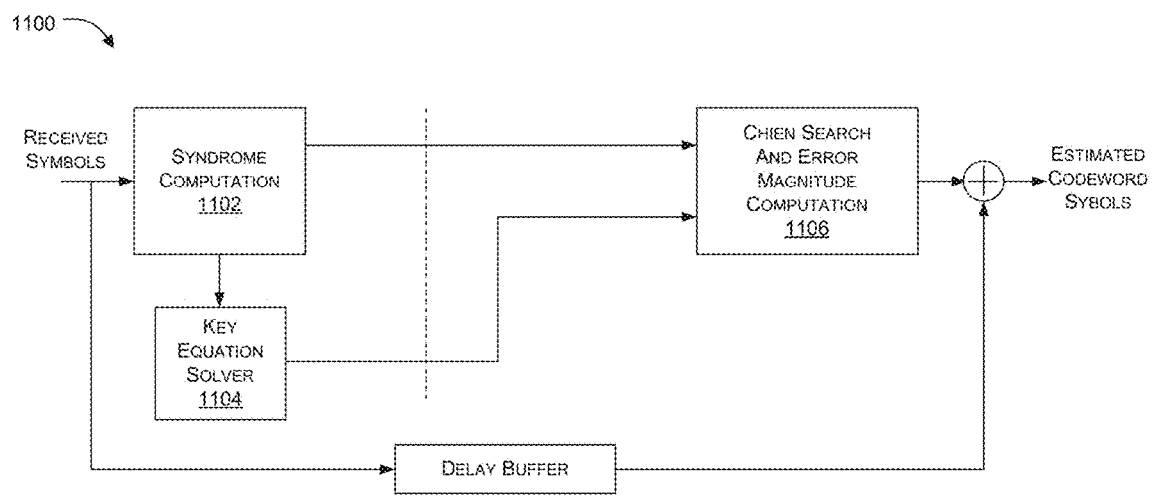
FIG. 11 illustrates an exemplary 2-stage low latency pipelined decoder in which the syndrome computation and KES computation are merged into a single stage in accordance with a preferred embodiment of the present disclosure.

In an exemplary embodiment, latency of the HDD decoder can be reduced significantly without affecting the throughput much if both SC and KES are merged into a single pipeline stage as shown in FIG. 4. FIG. 11 illustrates an exemplary 2-stage low latency pipelined decoder in which the syndrome computation 1102 and KES computation 1104 are merged into a single stage in accordance with a preferred embodiment of the present disclosure. Merging of SC 1102 and KES stage 1104 is possible because SC stage 1102 outputs one syndrome every clock cycle and KES stage 1104 takes one syndrome as input for every clock cycle from an array of syndromes into the 'temp register'. But, KES stage 1104 cannot start with SC stage as the 'temp register' needs to be initialized with $S_2, S_1, 0, \ldots 0$ as shown in FIG. 9. So, KES stage needs to wait for an additional two clock cycles. With this, the throughput is almost the same and size of the delay buffer also reduces significantly. In present implementation, rotating syndrome register shown in FIG. 9 may not be required. In an exemplary implementation, syndrome register shown in FIG. 8 can be used for loading one syndrome every clock cycle into the temp register. The latency of this decoder can be calculated using equation-12 by the sum of the clock cycles required for the SC and the Chien and error magnitude computation stage 1106.

$$\text{Latency} \approx 3t + \frac{n}{J} \text{(cycles)} \qquad \text{Equation-12}$$

For a given code of interest, if a decoder cannot afford parallelism when SC, and Chien search and error magnitude computation take almost 2t number of clock cycles, the proposed low-latency two stage pipelined architecture can be used without any issue, as both the syndrome calculation and Chien search and error magnitude computation stages take almost the same number of clock cycles. With the proposed combination of syndrome computation stage 1102 and key equation resolver stage 1104, the decoder does not need to time multiplex KES architecture with multiple SC and Chien search and error magnitude computation blocks, as required in popular three-stage pipelined architecture to reduce the pipeline stalling. In an exemplary implementation, multiple KES in parallel can be used to handle multiple received vectors and to achieve higher throughput.

As one may appreciate, throughput and latency of the LCC decoder is better than the previous decoder. As a summary, multiplicity assignment unit takes n=255 cycles to get unreliable locations and corresponding $r_i^{[2HD]}$ values. In an exemplary implementation, a state machine can be used to control $EN_1, EN_2, \ldots, EN_\eta$ and get all the $2^\eta$ test vectors.

In an exemplary implementation, each test vector of the $2^\eta$ test vectors can be passed through the proposed 2-stage pipelined HDD, wherein the slowest stage in 2-stage pipelined HDD is Chien Search and error magnitude computation block, which takes $$t + \frac{n}{J} = 36 \text{ cycles for } J = 10.$$

Multiplicity assignment is started when $EN_3=0$; $EN_2=0$; $EN_i=1$ for $\eta=3$. This is possible because $$\left((2^\eta - 1) \times \left(t + \frac{n}{J}\right)\right) \leq n.$$

Therefore, in the long run, each received vector $r^{[HD]}$ takes n=255 cycles to get corrected. As a result, throughput and latency of Soft LCC decoder is given as follows by Equation-13 and Equation 14 respectively.

$$\text{Throughput}(t) = \frac{n \times m \times f_{max}}{n}(Gbps) \quad \text{Equation-13}$$

$$\text{Latency} \approx n + 2t + \left\{2^\eta \times \left(t + \frac{n}{J}\right)\right\}(cycles) \quad \text{Equation-14}$$

Table-4 below illustrates summary of RS decoder that uses 2-stage pipelined HDD with block length n=410.

TABLE 4

| Rate | 0.8 | 0.8195 | 0.839 | 0.861 | 0.878 | 0.897 |
|---|---|---|---|---|---|---|
| K | 328 | 336 | 344 | 352 | 360 | 368 |
| T | 41 | 37 | 33 | 29 | 25 | 21 |
| Throughput (Gbps) | 5.55 | 5.84 | 6.156 | 6.507 | 6.902 | 7.347 |

In order to compare the RS decoder of present disclosure with other designs in the literature, a RS (255,239) decoder has been designed over $GF(2^8)$. Choosing J=30 such that $$\frac{n}{J} \approx t = 8,$$

results in a throughput of 24 Gbps. There is a trade-off between area and throughput. One can save the area by choosing J=10, however with reduced J, throughput reduces to 12 Gbps. Table-5 below shows comparison between RS decoder with J=10 designed in accordance with present disclosure and a RS decoder v9.0 of Xilinx IP for RS (255,239) on Kintex-7 FPGA.

TABLE 5

|  | Xilinx IP | Proposed |
|---|---|---|
| LUTs | 1177 | 8774 |
| FFs | 1169 | 5272 |
| 36k BRAMs | 1 | 0 |
| 18k BRAMs | 2 | 0 |
| Max. Frequency (MHz) | 292 | 200 |
| Max. Throughput (Gbps) | 2.33 | 12 |
| Latency (cycles) | 470 | 55 |

As one may appreciate, no BRAMs are used in the proposed RS decoder, as all needed Galois field arithmetic is implemented using LUTs and FFs. In contrast, Xilinx IP utilizes huge memory in terms of two 18 k BRAMs and one 36 k BRAM, which saves the utilization of LUTs and FFs compared to the RS decoder of present disclosure. If one considers BRAMs, LUTs and FFs altogether, one can appreciate that the RS decoder of the present disclosure and Xilinx IP utilizes almost the same hardware resources. However, gain achieved in terms of throughput by RS decoder of present disclosure is almost five times, which is a significant improvement. If the error evaluation computation and error magnitude computation with J=10 were divided as independent pipeline stages, throughput would become 16 Gbps. The implemented design on Kintex-7 FPGA is validated using chip-scope as shown in FIG. 5.

Figures 12, 13:
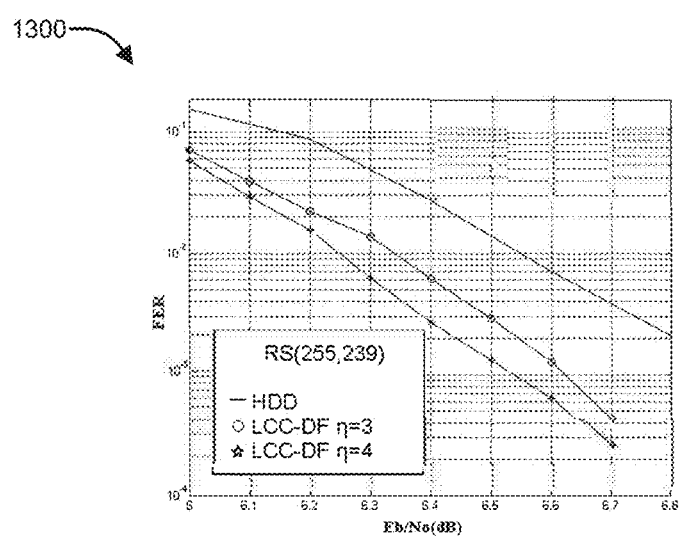
FIG. 12 shows result of RS (255,239) decoder designed on chipset.
FIG. 13 illustrates FER performance of HDD and LCC decoders for $\eta=3$ and $\eta=4$ designed in accordance with an embodiment of the present disclosure.

FIG. 12 shows result of RS (255,239) decoder designed on chipset.

In an aspect, Technology-Scaled Normalized Throughput (TSNT) index is used to evaluate different design performances with different fabrication technologies. As one may appreciate, TSNT index can be calculated using equation-15 as below.

$$TSNT = \frac{(\text{Throughput}) \times \left(\frac{\text{Technology}}{180}nm\right)}{(\text{Total number of gates})}(Mb/s/K\text{gate}) \quad \text{Equation-15}$$

Table 6 shows comparison of proposed RS decoder with J=10 with respect to competing decoder implementations. TSNT value of proposed 180-nm RS (255,239) decoder is at least 1.8 times better than existing designs, which indicates our decoder would be much more area efficient for a given throughput. Table 6 further illustrates that latency of the proposed 180-nm decoder is reduced by almost 80% compared to the existing 180-nm designs. Further, the proposed RS (255,239) decoder is more than five times better in latency than the RS (255,245) dual-line architecture even though the ECC ability in the RS (255,245) dual-line architecture is less than that of the proposed RS (255,239) decoder.

TABLE 6

|  | Architecture | | | | | |
|---|---|---|---|---|---|---|
|  | Proposed | | Design 1 | | | |
|  | A | B | A | B | Design 2 | Design 3 |
| Technology (nm) | 65 | 180 | 130 | 130 | 180 | 180 |
| Total Gates | 31657 | 34549 | 37600 | 30700 | 18400 | 20614 |
| Max. Frequency (MHz) | 588.23 | 285.71 | 606 | 606 | 640 | 400 |

TABLE 6-continued

| | Architecture | | | | | |
|---|---|---|---|---|---|---|
| | Proposed | | Design 1 | | | |
| | A | B | A | B | Design 2 | Design 3 |
| Latency (clocks) | 55 | 55 | 298 | 425 | 515 | 512 |
| Latency (ns) | 93.5 | 192.5 | 491.7 | 701.3 | 804.6 | 1280 |
| Throughput (Mbps) | 35293.8 | 17142.85 | 7357 | 4850 | 5100 | 3200 |
| NT | 1114.88 | 496.1896 | 195.7 | 158 | 277.17 | 155.23 |
| TSNT | 402.6 | 496.1896 | 141.33 | 114.11 | 277.17 | 155.23 |

Table-7 below shows comparison between an existing LCC decoder and LCC decoder of present disclosure. LCC decoder of present disclosure is implemented using 2-stage pipelined HDD, and consumes more hardware resources than the existing LCC decoder. However, it works with a higher throughput and lower latency. If error evaluation computation and error magnitude computation in HDD were divided as independent pipeline stages, the LCC decoder of present disclosure can meet the condition $$\left((2^\eta - 1) \times \left(\frac{n}{j}\right)\right) \le n$$

instead of $$\left((2^\eta - 1) \times \left(t + \frac{n}{j}\right)\right) \le n.$$

Therefore, LCC decoder of the present disclosure achieves the same throughput at a reduced hardware complexity.

TABLE 7

| | Existing [4] | Designed |
|---|---|---|
| LUTs | 5114 | 18584 |
| FFs | 5399 | 16621 |
| Max. Frequency (MHz) | 150.5 | 161.29 |
| Max. Throughput (Gbps) | 0.71 | 1.29 |
| Latency (cycles) | 1312 | 559 |
| Platform | Virtex-V | Kintex-7 |
| Xilinx ISE version | 9.2i tool | 14.6 tool |

FIG. 13 illustrates FER performance of HDD and LCC decoders for $\eta=3$ and $\eta=4$ designed in accordance with an embodiment of the present disclosure.

In an exemplary implementation, a RS (255,239) decoder implemented over GF ($2^8$) can be implemented on Kintex-7 FPGA using VHDL. As one may appreciate, throughput of the pipelined HD RS decoder is almost five times compared to the existing decoders with almost the same hardware resource utilization and operating at a maximum throughput of 24 Gbps. Throughput of SDD is almost twice compared to the existing designs. The overall processing latencies of SDD and HDD of present disclosure are reduced by almost 58% and 80% compared to the existing designs respectively.

RS decoder of the present disclosure uses interpolation and factorization free hybrid Low-Complexity Chase algorithm, and achieves required frame error rate (FER). RS decoder of the present disclosure can achieve same frame error rate (FER) performance at reduced complexity as the one in KV algorithm with m=4.

Figure 14:
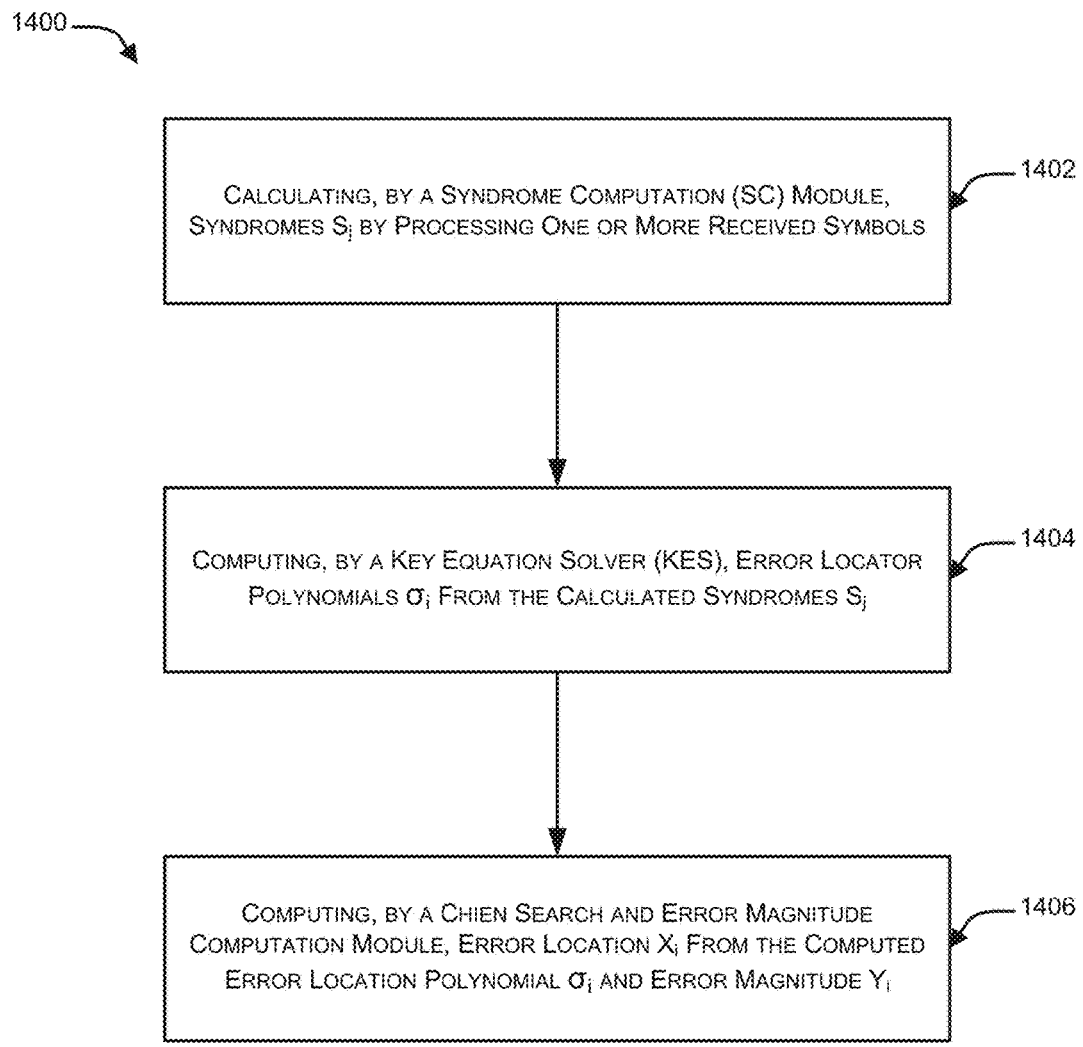
FIG. 14 illustrates an exemplary process depicting method of decoding by the proposed RS decoder in accordance with an embodiment of the present disclosure.

FIG. 14 illustrates an exemplary process depicting method of decoding by the proposed RS decoder in accordance with an embodiment of the present disclosure. In an exemplary aspect, the present disclosure provides a decoding method 1400 for a Reed-Solomon (RS) decoder, the method 1400 including steps of calculating, by a syndrome computation (SC) module, syndromes $S_j$ by processing one or more received symbols, at step 1402; computing, by a key equation solver (KES), error locator polynomials $\sigma_i$ from the calculated syndromes $S_j$, at step 1404; and computing, by a Chien search and error magnitude computation module, error location $X_i$ from the computed error location polynomial $\sigma_i$ and error magnitude $Y_i$ at step 1406.

In an exemplary aspect, error locator polynomials $\sigma_i$ are calculated from the calculated syndromes $S_j$ using Berlekamp-Massey algorithm, and error magnitude $Y_i$ is calculated using Forney's formula.

In an exemplary aspect, the method further includes the step of generating $2^\eta$ test vectors by a test vector generation module, wherein each test vectors of the $2^\eta$ test vectors is passed to the SC module.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides a RS decoder and method for high speed storage and communication system.

The present disclosure provides a configurable RS decoder and a method thereof that can enable configurable error correcting capability depending upon channel characteristics and performance.

The present disclosure provides a RS decoder that required less area and achieve high throughput and low latency for high speed storage and communication system.

The present disclosure provides a RS decoder that can achieve high throughout and low latency for high speed storage and communication applications.

We claim:
1. A Reed-Solomon (RS) decoder comprising:
   a delay buffer configured to buffer a plurality of test vectors, wherein size of the delay buffer depends on latency of the RS decoder;
   a syndrome computation (SC) module configured to process the plurality of test vectors and generate syn- dromes, wherein syndrome computation stage of the SC module takes 2t cycles to compute 2t syndromes;

a key equation solver (KES) configured to compute error locator polynomials; and a Chien search and error magnitude computation (CSEMC) module configured to find error location and corresponding error magnitude;

wherein the SC module, the KES and the CSEMC module are arranged in a 2-stage pipeline manner thereby reducing the size of the delay buffer.

2. The decoder of claim 1, wherein said RS decoder is a soft decision decoder (SDD).

3. The decoder of claim 2, wherein the SDD is configured to use interpolation and factorization free Low-Complexity-Chase (LCC) decoding.

4. The decoder of claim 1, wherein said RS decoder is a 2-stage hard decision decoder (HDD).

5. The decoder of claim 4, wherein the HDD is a t-symbol correcting decoder based on Berlekamp-Massey (BM) algorithm that takes 2t iterations to obtain error locator polynomials.

6. The decoder of claim 1, wherein said RS decoder is configured to monitor channel capacity, and adjust code parameters based on the monitored channel capacity.

7. The decoder of claim 1, wherein the KES computes error locator polynomials using Berlekamp-Massey (BM) algorithm or Modified Euclidean (ME) algorithm.

8. The decoder of claim 1, wherein a test vector generator module generates $2^n$ test vectors that are provided as input to the SC module.

9. The decoder of claim 1, wherein the error locator polynomials are obtained in 2t clock cycles without any parallelism to achieve high throughput of the RS decoder.

10. The decoder of claim 1, wherein the CSEMC module comprises J-Parallel Chien search architecture.

11. A decoding method in a Reed-Solomon (RS) decoder, the method comprising steps of:

buffering, by a delay buffer of the RS decoder, test vectors, wherein size of the delay buffer depends on latency of the RS decoder;

calculating, by a syndrome computation (SC) module of the RS decoder that is in communication with the delay buffer, syndromes $S_j$ by processing the test vectors;

computing, by a key equation solver (KES) of the RS decoder that is communication with the SC module, error locator polynomials $\sigma_i$ from the calculated syndromes $S_j$; and computing, by a Chien search and error magnitude computation (CSEMC) module of the RS decoder in communication with the KES, error location $X_i$ from the computed error location polynomial $\sigma_i$ and corresponding error magnitude $Y_i$, wherein the SC module, the KES and the CSEMC module are arranged in a 2-stage pipeline manner thereby reducing size of the delay buffer.

12. The method of claim 11, wherein the error locator polynomials $\sigma_i$ are calculated from the calculated syndromes $S_j$ using Berlekamp-Massey algorithm.

13. The method of claim 11, wherein the error magnitude $Y_i$ is calculated, by the CSEMC module, using Forney's formula.

14. The method of claim 11, wherein the method further comprises the step of generating $2^n$ test vectors by a test vector generation module, wherein each test vectors of the $2^n$ test vectors is passed to the SC module.

* * * * *